(12) United States Patent
Gilbert et al.

(10) Patent No.: US 7,495,511 B2
(45) Date of Patent: Feb. 24, 2009

(54) INPUT SYSTEM FOR A VARIABLE GAIN AMPLIFIER HAVING CLASS-AB TRANSCONDUCTANCE STAGES

(75) Inventors: Barrie Gilbert, Portland, OR (US); Todd C. Weigandt, Portland, OR (US); Eberhard Brunner, Waakirchen, DE (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/842,873

(22) Filed: Aug. 21, 2007

(65) Prior Publication Data

US 2007/0290757 A1    Dec. 20, 2007

Related U.S. Application Data

(60) Continuation of application No. 11/446,097, filed on Jun. 1, 2006, now abandoned, and a division of application No. 10/664,048, filed on Sep. 15, 2003, now Pat. No. 7,088,179.

(51) Int. Cl.
    *H03F 3/45* (2006.01)

(52) U.S. Cl. .................................. 330/254; 330/260
(58) Field of Classification Search ............... 330/252, 330/254, 260, 265; 327/359
    See application file for complete search history.

(56) References Cited

U.S. PATENT DOCUMENTS

| | | | |
|---|---|---|---|
| 5,077,541 A * | 12/1991 | Gilbert | ......................... 330/284 |
| 5,489,878 A | 2/1996 | Gilbert | |
| 5,684,431 A * | 11/1997 | Gilbert et al. | ............... 330/254 |
| 6,445,248 B1 * | 9/2002 | Gilbert | ........................ 330/51 |
| 6,525,601 B2 * | 2/2003 | Gilbert | ....................... 327/560 |
| 6,812,771 B1 * | 11/2004 | Behel et al. | ................. 327/359 |
| 6,906,588 B2 * | 6/2005 | Mouret et al. | ............... 330/254 |
| 7,196,577 B2 | 3/2007 | Brunner | |

* cited by examiner

*Primary Examiner*—Henry K Choe
(74) *Attorney, Agent, or Firm*—Marger Johnson & McCollom, PC

(57) ABSTRACT

A variable gain amplifier includes an attenuator having a plurality of pairs of tap points, and a plurality of pairs of gm cells, wherein each pair of gm cells is coupled to a corresponding pair of the tap points, and each pair of gm cells is constructed and arranged to operate as a multi-tanh cell.

18 Claims, 16 Drawing Sheets

INPUT SYSTEM FOR A VARIABLE GAIN AMPLIFIER HAVING CLASS-AB TRANSCONDUCTANCE STAGES

This application is a continuation of U.S. patent application Ser. No. 11/446,097 filed Jun. 1, 2006 entitled INPUT SYSTEM FOR A VARIABLE GAIN AMPLIFIER HAVING CLASS-AB TRANSCONDUCTANCE STAGES, which is a divisional of U.S. patent application Ser. No. 10/664,048 filed Sep. 15, 2003, now issued as U.S. Pat. No. 7,088,179 entitled SINGLE-ENDED INPUT, DIFFERENTIAL OUTPUT LOW NOISE AMPLIFIER, which are incorporated by reference.

BACKGROUND

Low noise amplifiers (LNAs) are used in many systems where low-level signals must be sensed and amplified. For example, LNAs are utilized in ultrasound imaging equipment to amplify the reflected signal sensed by an ultrasound sensor, and in radio receivers to amplify the radio frequency (RF) signal received by the antenna. The dynamic range of an LNA is limited by the noise floor at the low end and by distortion at the high end. Depending on signal frequency, an LNA can be implemented as an open loop or closed-loop amplifier and may also have a requirement to match a specific source impedance. At frequencies sufficiently below the $f_T$-limit of a semiconductor process, closed-loop, negative feedback designs are possible and offer improved distortion performance. Achieving a wide dynamic range and wide bandwidth with minimal power consumption is a chief design goal.

LNA input and output connections can be single-ended or differential. Where possible, differential output capability improves the dynamic range of an LNA and the circuits that it drives. Providing single-ended to differential signal conversion without an external transformer is especially valuable in many LNA applications.

Single-transistor, open-loop LNA designs are very common for RF frequency applications of 900 MHz and beyond, and often employ "local-series feedback" for some improvement in linearity. Narrowband input impedance matching can be accommodated with passive components, but these amplifiers are not well-suited to the voltage swing requirements and broadband matching needed in many non-RF applications. The prior art circuit shown in FIG. 1 uses a variation of the one-transistor amplifier design for non-RF applications, with an active input impedance matching feedback loop. Despite the excellent noise performance, voltage swing and passive component limitations reduce its usefulness in single-supply designs.

The prior art LNA circuit in FIG. 2 uses a non-inverting operational amplifier 11 configured for improved swing performance, with a conventional differential pair input stage. Input voltage noise is limited by input device thermal noise and the noise of the feedback attenuator resistors. Adequate current consumption in the input pair and an output stage capability for driving loads as small as 40 ohms (shown as R5,R6) result in an input referred voltage noise less than 0.70 nv/rt(Hz). Negative feedback reduces distortion of the input differential pair for frequencies within the bandwidth of the feedback loop. This configuration is not easily generalized to differential outputs or active input impedance synthesis, however.

Optimizing a differential amplifier for noise and distortion performance offers another alternative to LNA design. An example of such a prior art circuit is shown in U.S. Pat. No. 6,118,340, issued Sep. 12, 2000, "Low Noise Differential Input, Differential Output Amplifier and Method," (the '340 patent). In '340, FIG. 5 shows a feedback-linearized input V-I stage driving well-matched resistive loads. The well-defined gain of this approach allows for accurate active input impedance synthesis, which improves noise figure in applications that require input matching. Differential outputs in this circuit can also be driven from a single-ended input.

This design has various embodiments. When driving a very small gain-setting resistor RS to minimize input noise, high standing currents may be needed in the input stage to accommodate full input and output swing range. When driving a transimpedance load, shown in the '340 patent, FIG. 6, the non-linearity of the output stage is not linearized by the central feedback loop.

The prior art circuit in FIG. 3 shows another differential amplifier approach, from "A Programmable Instrumentation Amplifier for 12-Bit Resolution Systems," Wurcer, et al., IEEE Journal of Solid-State Circuits, Vol. SC-17, No. 6, December 1982 (the "Wurcer paper"). This circuit provides a unique means of generalizing the non-inverting feedback amplifier approach, described previously, to a fully differential implementation with only one core amplifier stage required, at a considerable savings in complexity and power consumption.

The input signal is applied to bases of a central differential pair, while negative feedback is taken to the emitters. Constant current biasing of the input stage allows each of the input transistors Q1,Q2,Q3,Q4 to complete a negative feedback loop when fed by a resistor attenuator (R57-RG-R56) connected to the differential outputs. This greatly improves input stage linearity for frequencies within the bandwidth of the feedback loop, and offers the possibility of low noise operation if the input standing current and gain setting resistor, RG, are chosen correctly.

The use of operational amplifiers buffers for amplifiers A1 and A2 described in the Wurcer paper, which is furthermore referenced to a central bias voltage VB, results in bandwidth limitations and additional complexity and power consumption for use as an LNA stage. Also a single-ended signal applied to only one of the two inputs does not produce a balanced differential output signal.

DETAILED DESCRIPTION

This patent encompasses numerous inventions relating to amplifiers. For convenience, the various inventions disclosed in this application are sometimes referred to collectively or individually as "the present invention". It will be understood, however, that these inventions have independent utility and are independently patentable. In some cases, additional benefits are realized when some of the principles are utilized in various combinations with one another, thus giving rise to yet more patentable inventions.

These principles may be realized in numerous different embodiments. Although some specific details are shown for purposes of illustrating the preferred embodiments, other effective arrangements can be devised in accordance with the inventive principles of this patent. Thus, the inventive principles are not limited to the specific details disclosed herein.

Low Noise Amplifier

Figure 4:
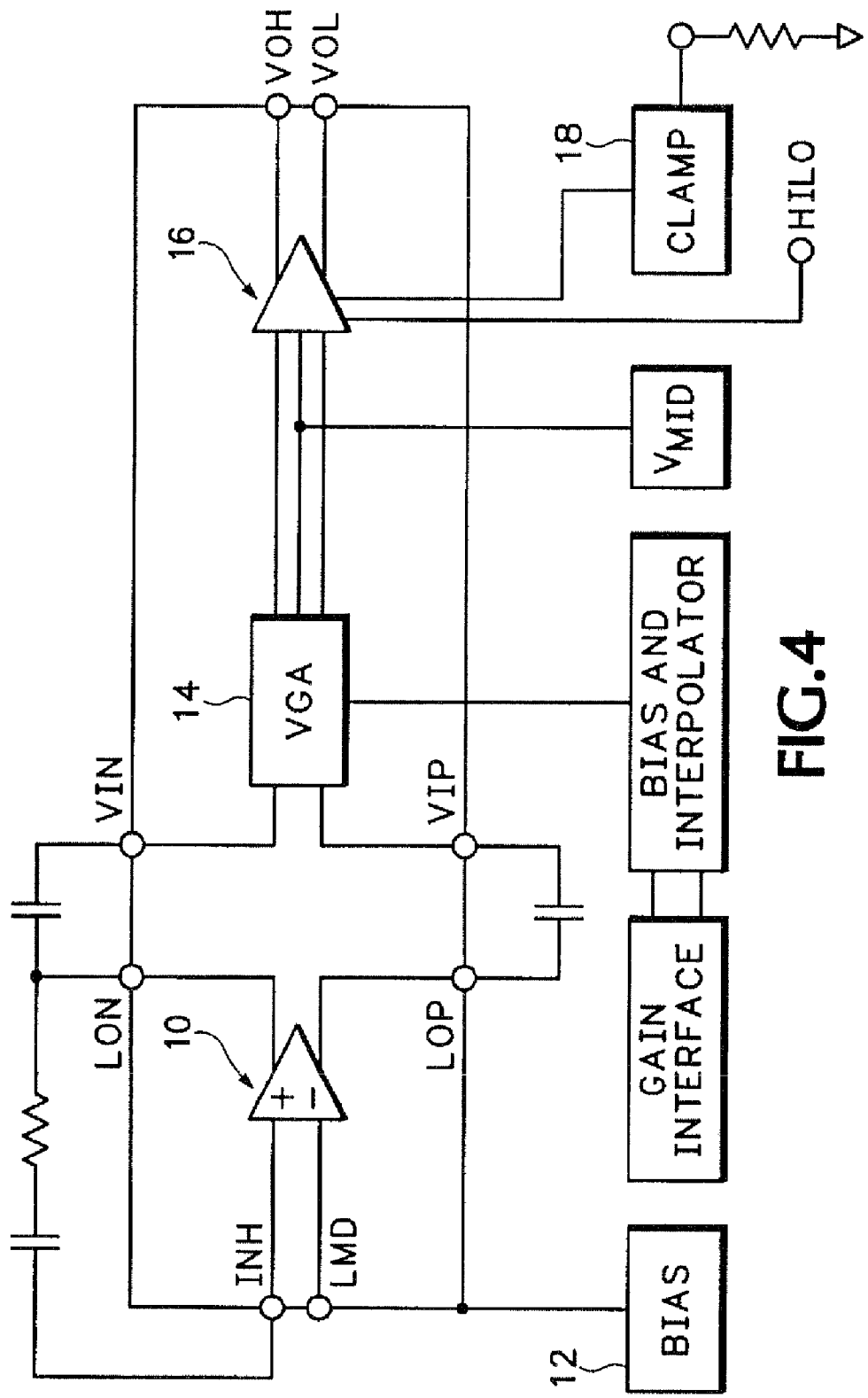
FIG. 4 is a block diagram of an embodiment of a variable gain amplifier with an ultralow noise preamplifier according to the inventive principles of this patent.

An embodiment of a low-noise amplifier as a preamplifier for a variable gain amplifier (VGA) is shown in FIG. 4. This particular embodiment is one channel of a dual-channel VGA, so some components may be shared between the channels, the other channel not being shown. The low-noise amplifier (LNA) 10, receives an input signal INH and is biased by a bias generator 12. The LNA may produce differential outputs, a non-inverting output LOP and an inverting output LON. As shown here, these outputs are used as inputs to a VGA 14, which produces an amplified signal. A post amplifier 16 may provide selectable gain with an optional output clamp 18 to provide adjustable output voltage limiting.

As shown here, the LNA provides differential outputs to the VGA 14. Alternatively, the LNA may be implemented as a stand-alone device. It only needs a single input signal INH to produce either a differential output, in the form of signals LOP and LON, or a single output, typically LOP, as will be discussed in more detail later.

Figure 5:
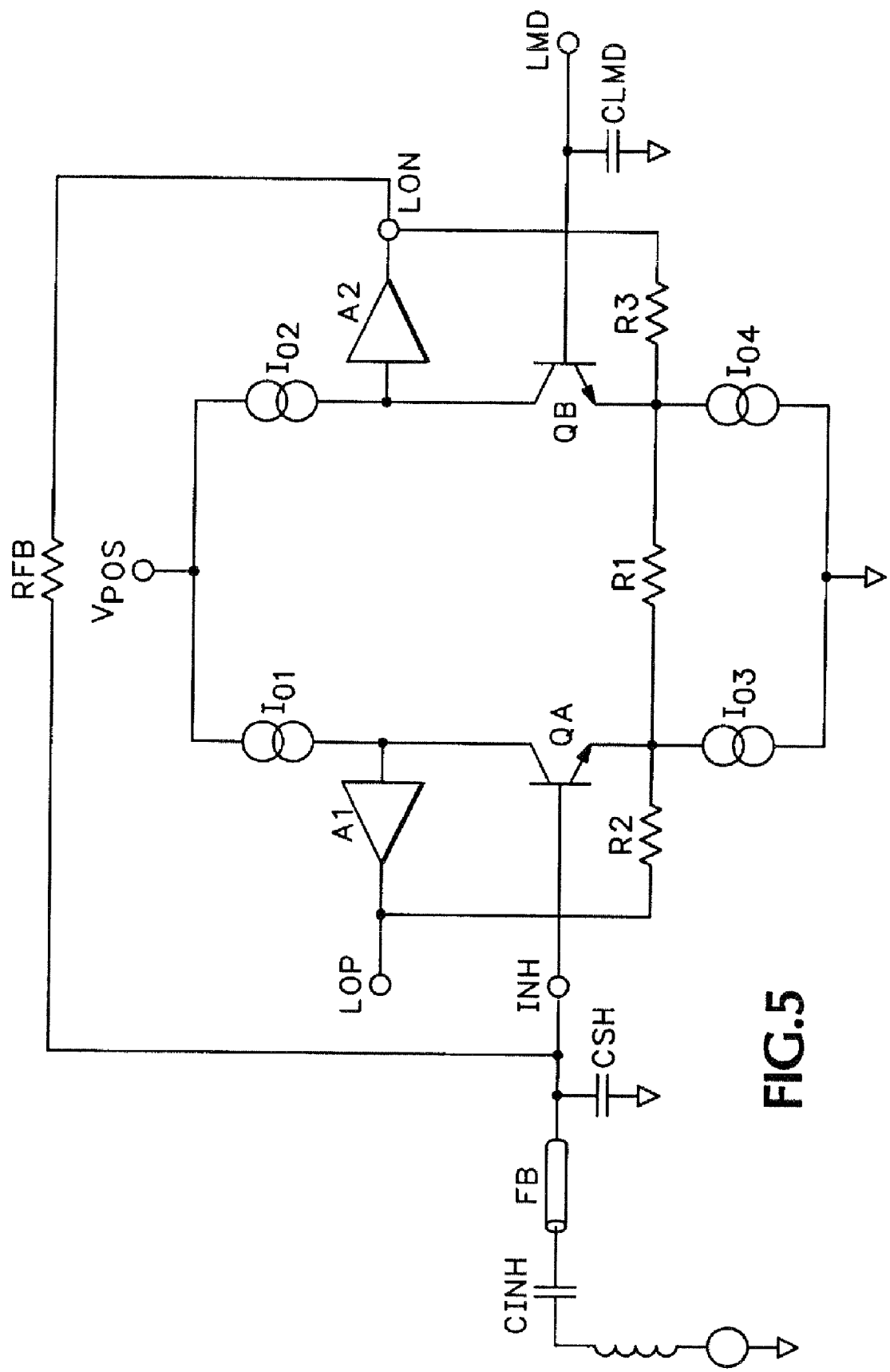
FIG. 5 is a schematic diagram of an embodiment of a low noise amplifier according to the inventive principles of this patent.

An embodiment of a low-noise amplifier in accordance with the present invention is shown in FIG. 5. The LNA is a single input, differential output amplifier, with signal input pin INH and an AC coupled signal ground pin LMD. An alternate configuration for differential inputs is also possible, using pin LMD as the second input (INL). The central transistors of the input stage, QA and QB, are biased at a constant current by two current sources I01, I02 connected to voltage supply VPOS and two current sources I03, I04 connected to ground. Their emitters are tied together by resistor R1, which is part of a differential feedback network.

The input signal applied between pins INH and LMD is amplified to high-impedance nodes at the collectors of QA and QB. The voltages at these nodes are then amplified by a second gain stage. Amplifier A1, connected to the QA collector drives non-inverting output LOP, and a similar amplifier A2, connected to the QB collector drives inverting output LON. Feedback resistor R2, from the LOP output to the emitter of QA, and R3, from the LON output to the emitter of QB, complete a negative feedback connection around the first and second gain stages and allow the input transistors to operate at constant current.

This negative feedback configuration has several important advantages. Current flowing through the feedback resistors can accommodate current source mismatches that would otherwise create uncertainty in the output common mode voltage. Constant current in the input stages improves input stage linearity, allowing the input voltage to be impressed across R1. The improvement in input stage linearity is similar to that in the aforementioned '340 patent, and similar prior art, but with a difference.

In the prior art examples, a large standing current is required in the input stage, since the signal current imparted by a voltage between the emitters of the input differential pair is drawn from the bias current sources. This serves as an impediment to very low noise designs in which a small resistor is required for noise purposes, and hence large signal currents across it. For example an 8 ohm emitter degeneration resistor, such as RS in the '340 patent would require 6.25 mA of bias current in each of the two input transistors to support an input swing amplitude of +/−250 mV.

In the present invention, signal current across resistor R1 is provided by the output stages, through negative feedback resistors R2 and R3. Hence, a smaller quiescent current can be used to bias the input stage while still allowing for wide input and output voltage swings. This results in better noise performance for a given power consumption, an important metric in LNA design, With a quiescent current of only 2 mA per side, the present invention is capable of 0.72 nV/rt(Hz) input noise voltage and accommodates input signals of greater than +/−250 mV amplitude across a small resistor R1, which may have a value as low as 8 ohms. Furthermore, amplifiers A1 and A2 are incorporated in the feedback loop for improved linearity, which allows them to operate at reduced quiescent currents as well, for a given distortion requirement.

Figure 1:
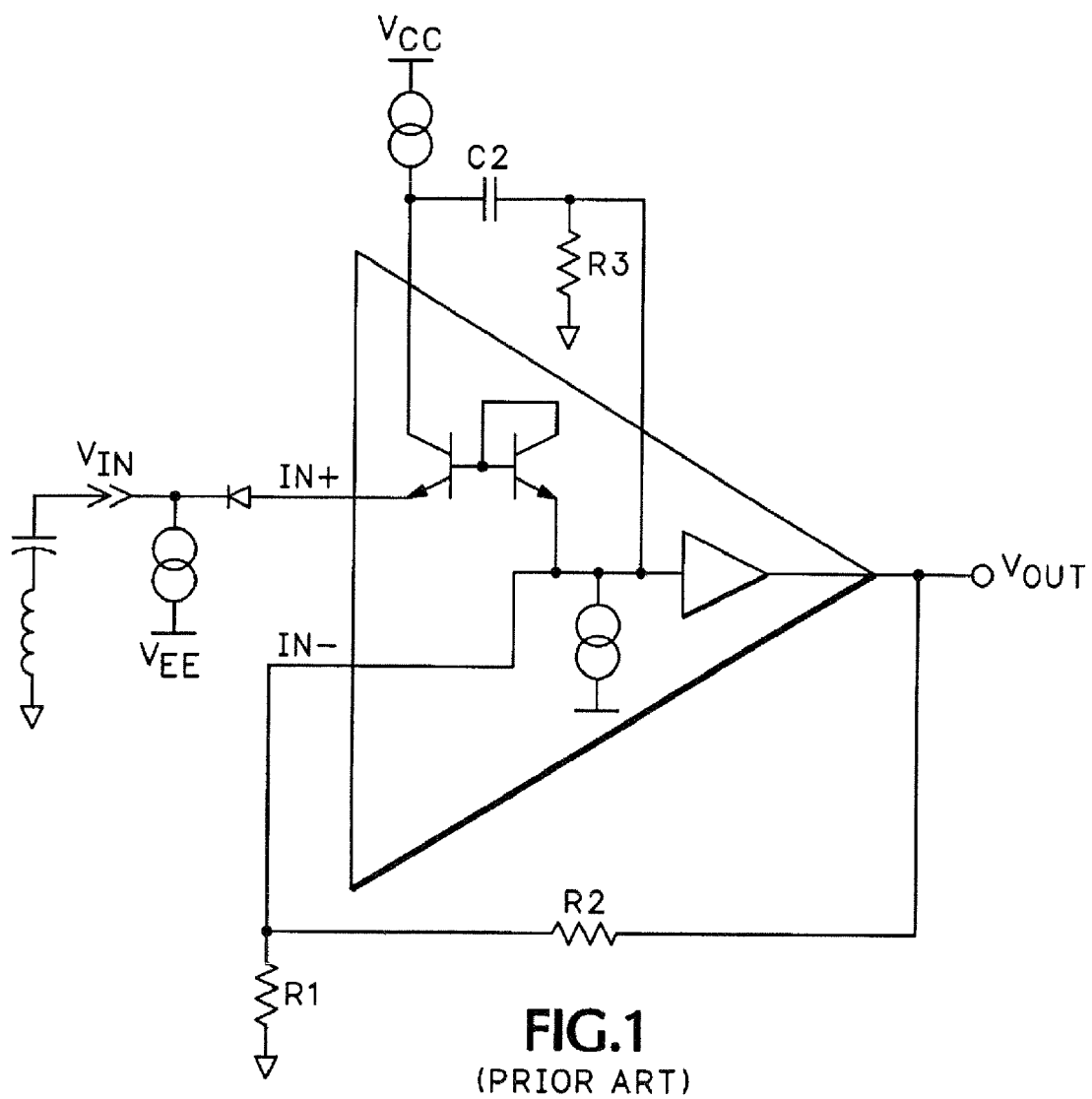
FIG. 1 is a schematic diagram of a prior art LNA with impedance matching.
Figure 2:
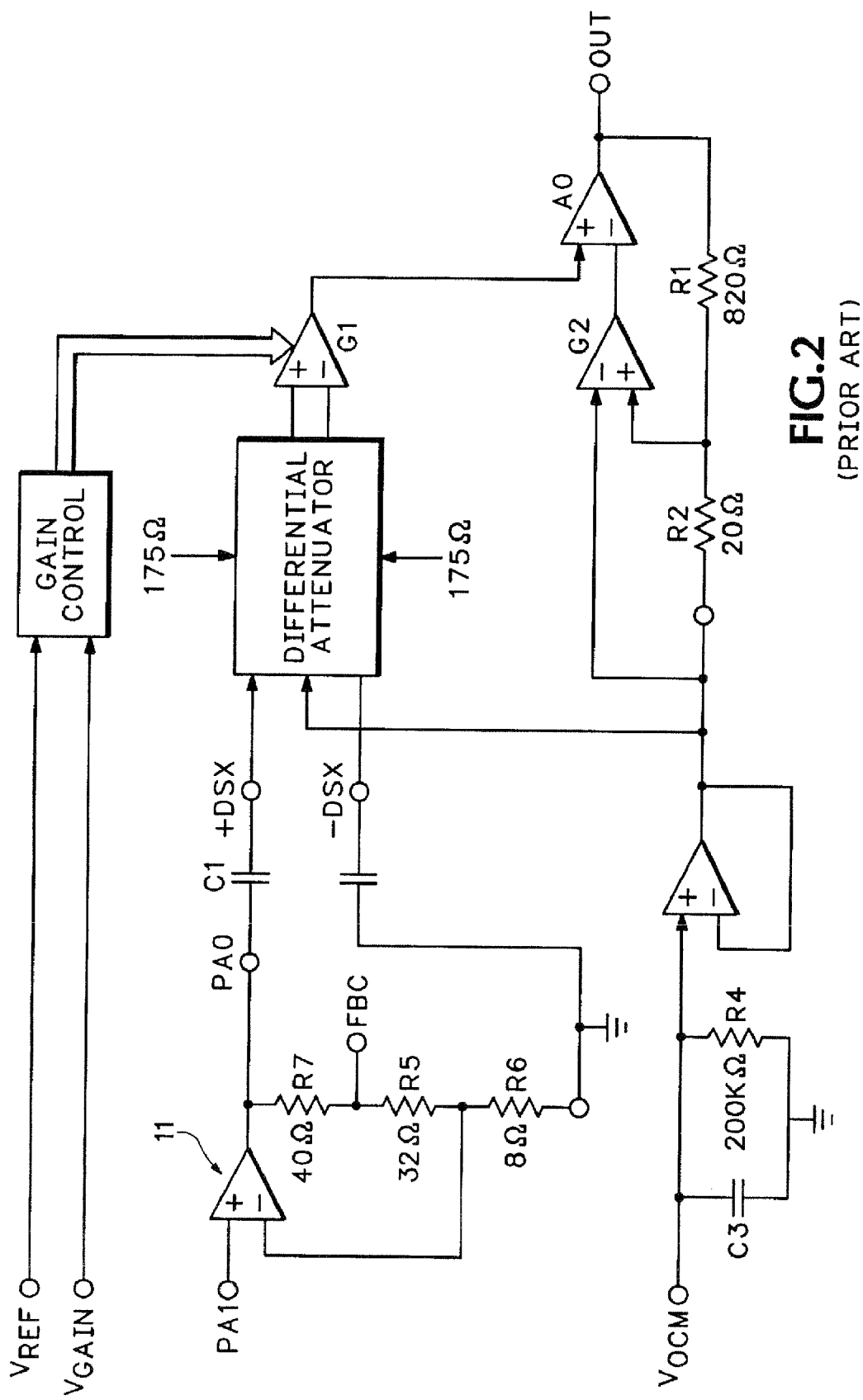
FIG. 2 is a schematic diagram of a prior art LNA using a non-inverting operational amplifier.
Figure 3:
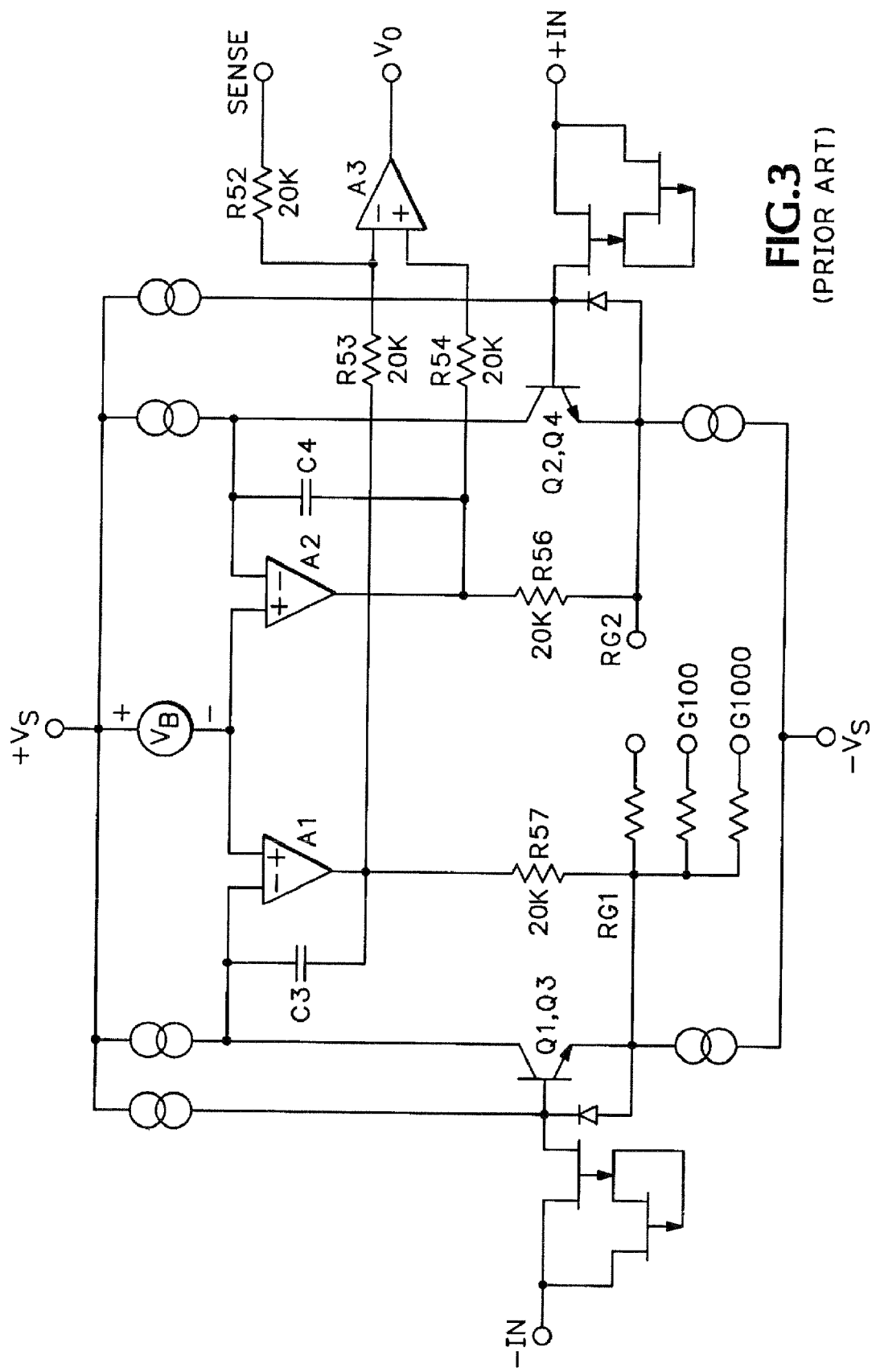
FIG. 3 is a schematic diagram of a prior art differential amplifier.

The second stage amplifiers A1 and A2 will be described in more detail later. For ease of discussion, only amplifier A1 will be discussed in detail. In one embodiment, a simple gain stage may be used for high bandwidth purposes, which extend the range of use and improves distortion at mid-band frequencies. A second possible need is an output stage capable of driving the low impedance feedback network, without excessive quiescent current. This is in contrast with the prior art circuit in FIG. 3, which utilizes operational amplifier buffers A1 and A2. This approach leads to very high linearity at low frequencies, but limits the overall amplifier bandwidth considerably, to a value well below the unity gain bandwidth of the operational amplifier stages in order to insure stability. It also increases complexity and power consumption.

Resistors R2 and R3 are chosen in conjunction with R1 to set the desired LNA gain. Since input stage transistors QA and QB are biased at constant current, the voltage impressed on R1 generates signal current that flows through R2 and R3, leading to a proportional voltage drop, or rise, across those devices to the outputs. For a differential input signal, the gain to pins LOP and LON is given by (R2+½*R1)/R1 and (R3+½*R1)/R1, respectively, for a net gain of (R2+R3+R1)/R1. This gain can also be demonstrated by considering an equivalent differential half-circuit for the amplifier, with the same result.

The value of resistor R1 is chosen to be small for low-noise applications, since its own thermal noise, which is proportional to resistance, contributes directly to the input. For example, 8 ohms is shown in the more detailed embodiment which follows, as an example, although a wide range of values are possible within the spirit of this invention for different trade-offs between noise and power consumption. The gain of the LNA is also chosen for a specific application. A gain of 9 is used as an example, in which case resistors R2 and R3 values are nominally chosen to be 32 ohms. This results in a total of 72 ohms between output terminals OPH and OPL, which may require a drive capability in excess of +/−35 mA for output signals with amplitude of +/−2.5V.

A single-ended input signal applied to the LNA in FIG. 5 will not produce a balanced differential output signal if equal values are chosen for R2 and R3. If the input to constant-current biased transistor QB remains at signal ground, then its emitter voltage is fixed, and the gain to output terminals LOP and LON are changed. The gain to pin LOP can be shown to be given by the ratio (R2+R1)/R1 and the gain to LON by R3/R1, for this case since the whole input signal is applied to only one side with respect to the signal ground impressed upon the emitter of QB. To achieve balanced outputs, and hence better swing and distortion performance in subsequent stages, values for R2 and R3 are chosen in this design to equate the gains to the two outputs. For the embodiment of FIG. 5 with a single-ended input specification, these values are 28 ohms for R2 and 36 ohms for R3 using the R1 value from the example above, for a net gain of 4.5 on each side. This arrangement is in contrast to the prior art shown in FIG. 3 which only discloses equal values for R56 and R57.

Signal input pin INH and ground pin LMD are generally AC coupled. As a preferred implementation, input biasing is designed to center the DC input voltage at approximately "one Vbe" above the mid-supply voltage thereby centering the common mode output voltage at 2.5V for maximum signal swing.

The LNA supports active impedance matching through an external shunt feedback resistor RFB from the inverting output LON to the input signal INH. This will be discussed in more detail further.

A high input impedance would be seen looking into the INH terminal of the embodiment shown in FIG. 5, limited generally by a DC bias network, not shown. This remains true unless optional resistor RFB and capacitor CFB are included to form a shunt feedback loop across the LNA. In this case, the input impedance looks resistive, with a value equal to RFB/(1+A0) for frequencies within the bandwidth of the shunt feedback loop, set by the closed-loop bandwidth of the core low-noise amplifier. This is called active input impedance synthesis.

The gain A0 is that seen from terminal INH to LON, and is generally one-half the total closed loop gain of the core LNA. The polarity of the gain is inverting, for negative feedback. The actual input impedance realized is this synthesized impedance in parallel with any other biasing resistance and the input impedance of transistor QA in the input stage. Capacitor CFB isolates the DC input levels at input and output and is not absolutely required; though it helps with current consumption and load balancing, especially for low valued resistors RFB.

To synthesize an active input impedance of 50 ohms, a resistor with value near 275 ohms would be used, for example, if the LNA had a gain of 9 (A0=4.5). The ability of the output stage to drive a low resistance central feedback network is further beneficial in driving low values of resistor RFB to enable synthesis of low input impedances. The active input impedance approach described here can be readily generalized to the case of a differential input amplifier, in which case a second RFB and CFB network is placed from node INL (or LMD in FIG. 5) to LOP. The differential input impedance is equal to 2*RFB/(1+A0).

Active input termination has several benefits when used. In RF systems, input impedance matched to the source driving the LNA improves dynamic range. In applications such as ultrasound where the amplifier is positioned at the end of a cable connected to elements of the signal transducer, matched input impedance improves the transient response, for numerous benefits in imaging. Although a shunt resistor placed between the input terminal and ground can also be used to match the source impedance, it adds significant noise, of itself, and can be shown to significantly boost the contribution of the LNA noise when referred to the generator side of the match. An actively matched input termination reduces the contribution of the matching resistor by a factor of 1+A0, and can be shown to reduce the contribution of the LNA to the system noise by a similar factor. Also, these benefits in input voltage noise may directly improve the noise figure which is a relative performance metric used to compare LNA designs.

As another embodiment involving external components, a ferrite bead may be useful. For example, when a long trace to the input INH is unavoidable, or when the LNA is configured as one of two channels and both channels are used to drive external circuits, the ferrite bead FB may provide circuit stability with negligible effect on noise. Other external components may be used with the LNA, these are just set out as examples of the environments in which the LNA may be used.

Figure 6:
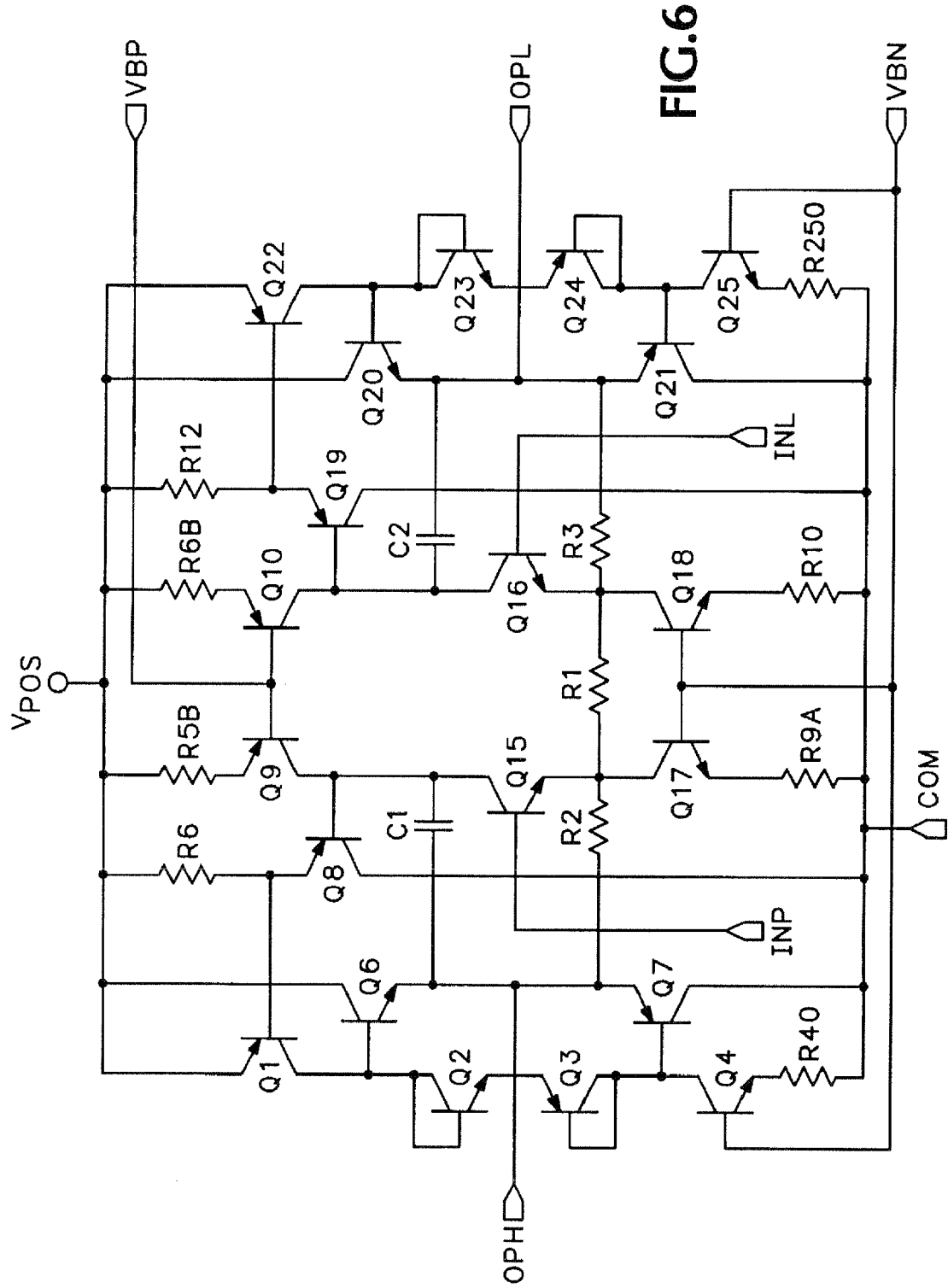
FIG. 6 is a more detailed schematic diagram of an embodiment of a low noise amplifier according to the inventive principles of this patent.

The internal workings of one embodiment of an LNA are shown in more detail in FIG. 6. In FIG. 6, the current sources IO1 and IO2 are shown in more detail, being comprised of Q9, R5B, Q10 and R6B. Current sources IO3 and IO4 are comprised of Q17, R9A, Q18 and R10. Node voltages for VBP and VBN can be defined by current mirrors from a separate biasing circuit, which could take on a number of forms.

QA and QB are also shown in more detail, being Q15 and Q16 in FIG. 6. The input signal INL of FIG. 6 is the ground signal LMD of FIG. 5. This differential pair-like structure of Q15 and Q16 is a first gain stage. A network of resistors R1, R2 and R3 provide feedback to the emitters of Q15 and Q16 through an electrical connection between the emitters of Q15 and Q16 and the output node nodes, as described previously.

The input signal amplified by the first stage to the collectors of Q15 and Q16 sees a second stage of amplification beginning at the bases of Q8 and Q19. For ease of discussion, only one half of the differential outputs will be discussed here. Emitter follower stage Q8 drives a common emitter amplifier stage Q1. In this schematic, Q1 drives a current source load in the form of Q4, R40. The collector of transistors Q1 and Q4 are both high impedance nodes. The actual current is driven through diode-connected transistors Q2 and Q3, which are part of a trans-linear voltage loop including the base-emitter junctions of Q2, Q3, Q6 and Q7.

These transistors form a "constant product", class-B output stage. Class B, as the term is used here, is an output stage that may generate output currents larger than their quiescent currents. In addition, the output stage may be implemented by Metal Oxide Semiconductor (MOS) transistors. Such a stage is capable of delivering very high currents through push-pull output transistors Q7 and Q6 with minimal quiescent current in that leg, and reasonable quiescent current in the transistors Q1, Q2, Q3, Q4.

From the base of emitter follower transistor Q8 through Q1, there is a net current gain of $\beta^2$ to help supply base current to Q6 for driving peak output currents. This also improves the internal slew-rate for driving the large capacitance associated with Q6. In this design the second stage current bias set by Q4, R40 needs to be large enough to support the peak base-current requirements of transistor Q7. Compensation capacitors C1 and C2 are connected from the high impedance node at Q15 and Q16 collectors to output nodes OPH and OPL, respectively.

Note that other choices of output stage could also be considered to complete the core amplifier. For example, transistor Q1 could drive a "rail-to-rail" class-B output stage for similar reduction in quiescent current and an improved output voltage swing relative to the "push-pull" stage shown here.

Figure 7:
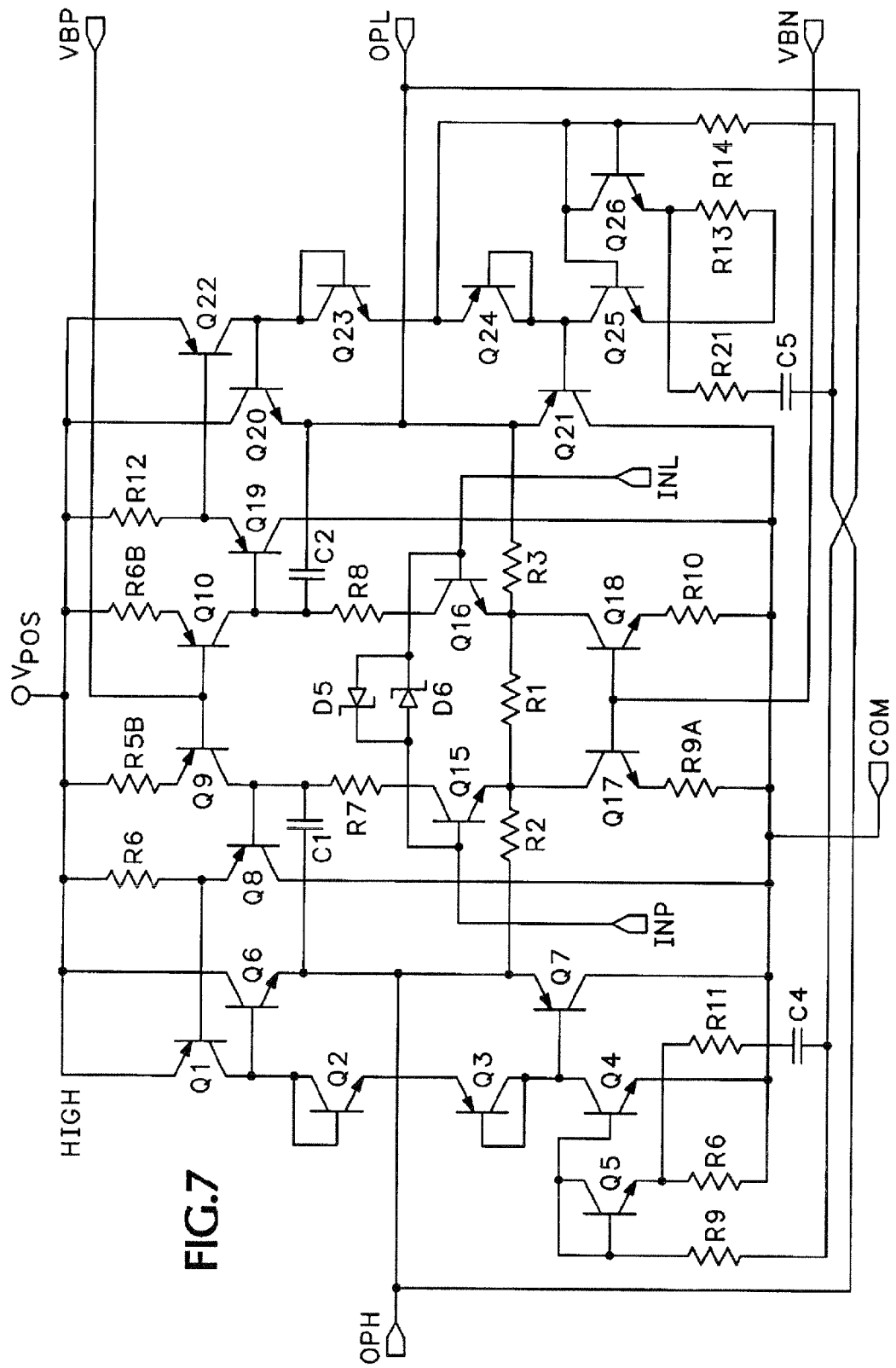
FIG. 7 is a more detailed schematic diagram of an embodiment of a low noise amplifier according to the inventive principles of this patent.

In the more detailed embodiment shown in FIG. 7, a nonlinear current mirror is used to bias the second stage amplifier current sources, for further current savings. The output terminal OPL defines a current through resistor R9, diode connected transistor Q5, and R6. This current is mirrored non-linearly to set the bias current for current-source transistor Q4, which loads the second gain stage. When output OPL rises above its quiescent output level, a larger current is produced in Q5 and an exponentially larger current in Q4. This allows Q4 to supply the needed base current to pull-down transistor Q7, of the output stage, which is simultaneously sinking current to pull output OPH low. The additional current also helps with the transient response, improving the internal slew-rate limit for driving the base of transistor Q7. The net effect is that a lower quiescent current can be established in the second gain stage since more current is available when needed.

Another added detail in this embodiment is output protection on Q15 and Q16 provided by diodes D6 and D5. These diodes help the circuit return to linear operation more quickly when an input voltage exceeding the maximum linear voltage of the LNA is attained. In some semiconductor processes, they further protect input devices against reverse-VBE degradation, which could damage the circuit over time.

Selectable-Gain Amplifier

Some additional inventive principles of this patent relate to selectable-gain amplifiers. In many situations it is useful to provide an amplifier having two different gain settings. For example, if a VGA is used to drive an analog-to-digital converter (ADC or A/D converter), it may be useful to provide two different gain ranges: a high gain range for driving 10-bit converters, and a low gain range for driving 12-bit converters.

Figure 8:
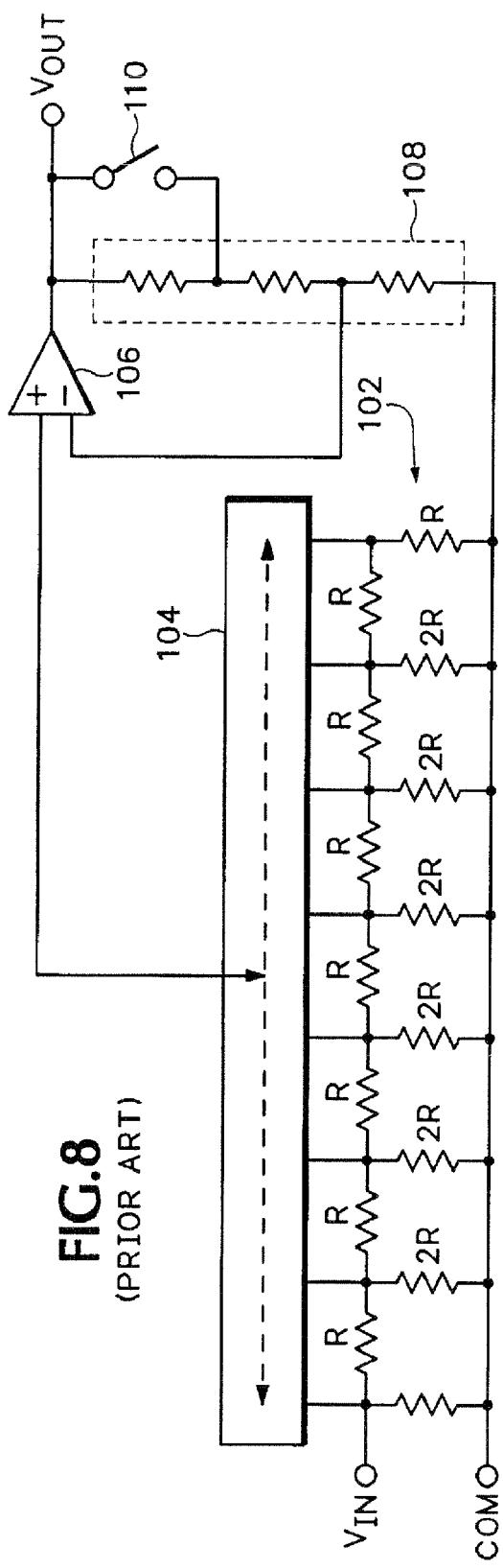
FIG. 8 illustrates a prior art variable gain amplifier having a continuously interpolated attenuator.

FIG. 8 illustrates such an arrangement which is based on a VGA having a continuously interpolated attenuator. The input signal is applied to an attenuator network 102. Attenuated versions of the input signal are available at tap points along the attenuator. A steering circuit 104, typically based on a series of transconductance (gm) cells controlled by an interpolator, selects the signals from one or more tap points and feeds them to a fixed gain amplifier 106. By selecting various tap points along the attenuator and merging the signals from adjacent tap points, the steering circuit provides continuously variable gain control. A switched feedback network 108 for the fixed gain amplifier allows the user to switch between high and low gain ranges by opening or closing switch 110.

Although the circuit of FIG. 8 provides a workable solution in some situations, it is difficult to implement the switch 110 in many types of integrated circuits (ICs). Another problem with the arrangement of FIG. 8 is that there is a gain-bandwidth tradeoff between the gain ranges. That is, the circuit has a certain bandwidth when operating in the low-gain mode, and a different bandwidth when operating in the high-gain mode.

Figure 9:
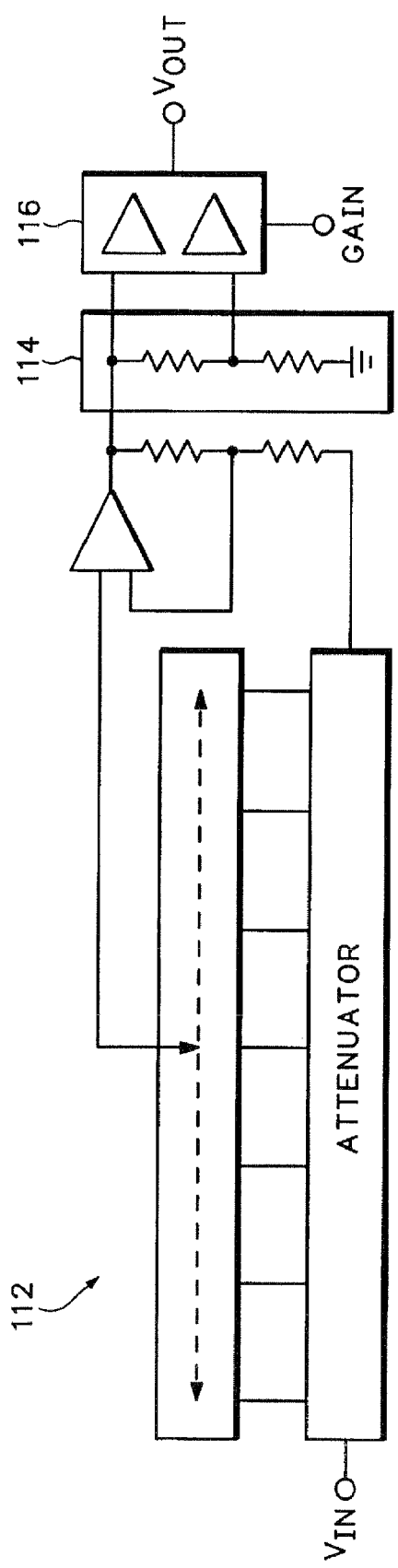
FIG. 9 illustrates an embodiment of a selectable gain amplifier according to the inventive principles of this patent.

FIG. 9 illustrates an embodiment of a technique for providing selectable gain ranges in accordance with the inventive principles of this patent. The circuit of FIG. 9 includes a VGA 112 which, for purposes of illustration, is shown to be of the continuously interpolated type having a fixed-gain output stage. The output from the VGA is applied to another attenuator network 114 which provides two or more attenuated signals. A selection stage 116 selects one of the attenuated signals which can then be used directly as the output, or applied to any number of additional stages for buffering, filtering, level-shifting, etc. Since the selection stage may be realized as a series of gm stages having their outputs coupled together, it can be easily implemented on most integrated circuits. The gm stages can be turned on and off by selectively enabling or disabling their bias currents.

Figure 10:
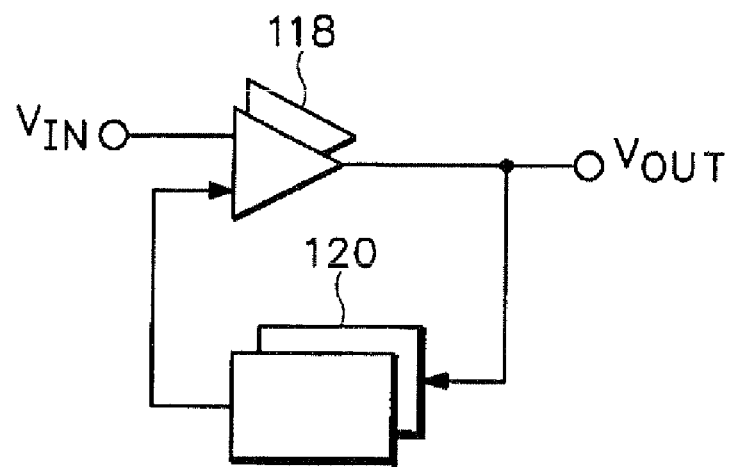
FIG. 10 illustrates another embodiment of a selectable gain amplifier according to the inventive principles of this patent.

FIG. 10 illustrates an embodiment of another technique for providing selectable gain ranges in accordance with the inventive principles of this patent. The circuit of FIG. 10 includes two or more selectable gain stages 118 and two or more feedback paths 120 coupled between the inputs and outputs of the gain stages. An advantage of this arrangement is that it may optionally be configured to provide constant bandwidth operation. Another advantage is that it may optionally be configured to provide constant input-referred noise since the attenuation is in the feedback path rather than the input as in the circuit of FIG. 9.

Figure 11:
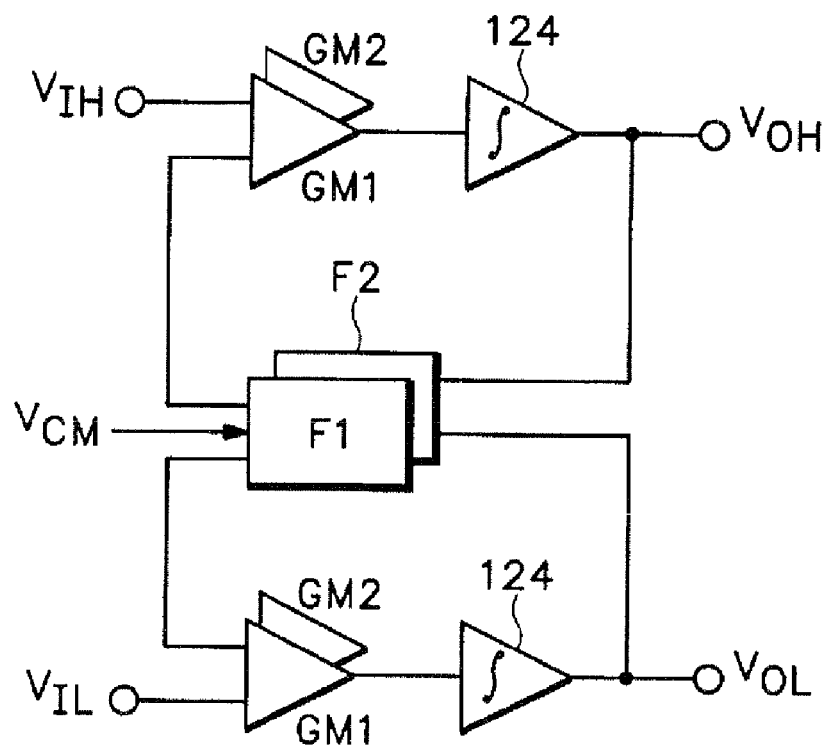
FIG. 11 illustrates a differential embodiment of a selectable gain amplifier according to the inventive principles of this patent.

FIG. 11 illustrates a fully differential embodiment of a selectable gain amplifier in accordance with the inventive principles of this patent. In this embodiment, the selectable gain stages 122 in each half of the circuit are implemented as transconductance cells GM1, GM2 followed by an integrator 124. The feedback paths F1, F2 are combined in feedback network having a common mode reference point CM. As with the circuit of FIG. 10, each half circuit may include additional gain stages and feedback paths.

Figure 12:
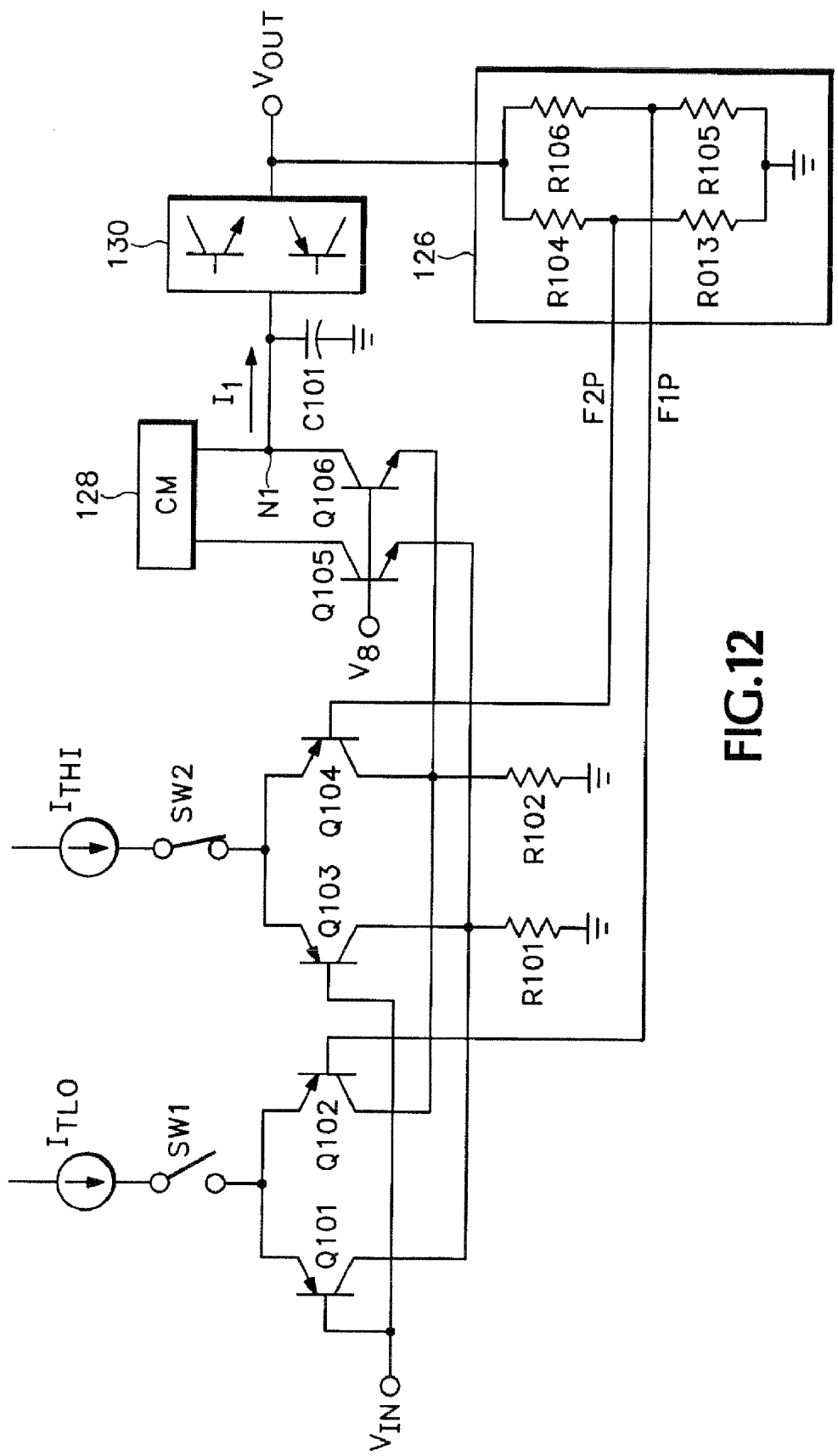
FIG. 12 illustrates some preferred implementation details of a single-sided embodiment of a selectable gain amplifier according to the inventive principles of this patent.

FIG. 12 illustrates some preferred implementation details of a single-sided embodiment of a selectable gain amplifier according to the inventive principles of this patent. The circuit of FIG. 12 includes a pair of gm cells Q101,Q102 and Q103, Q104 that are selectively enabled by applying a bias (or "tail") current to one cell or the other. In low-gain mode, the low-gain cell Q101,Q102 is enabled by applying the bias current $I_{TLO}$ to the cell through switch SW1. In high-gain mode, the high-gain cell Q103,Q104 is enabled by applying the bias current $I_{THI}$ to the cell through switch SW2. The input signal $V_{IN}$ is applied to one side of each differential pair of transistors that form the gm cells. In this embodiment, the feedback network 126 includes two resistive voltage dividers. A first divider R103,R104 divides the final output signal $V_{OUT}$ to provide a feedback signal to the other side of the low-gain cell Q101,Q102. A second divider R105,R106 divides the output signal $V_{OUT}$ to provide a feedback signal to the other side of the high-gain cell Q103,Q104.

The gm cells have their outputs coupled in parallel and are loaded by resistors R101 and R102. This generates a differential voltage output signal that is applied to a folded cascode arrangement including cascode transistors Q105 and Q106, which have their bases anchored at a bias voltage $V_B$, and a current mirror 128 which forces the signal to appear as a current $I_1$ at node N1. This current is integrated in capacitor C101 which generates a voltage signal that drives an output stage 130 (shown here as a push-pull arrangement) which in turn generates the final output signal $V_{OUT}$.

In low-gain mode, the gm cell Q101,Q102 is enabled, and the overall gain is determined by resistors R103,R104. In high-gain mode, the gm cell Q103,Q104 is enabled, and the overall gain is determined by resistors R105,R106.

The circuit of FIG. 12 may be configured to provide constant bandwidth operation by choosing different values for $I_{TLO}$ and $I_{THI}$. The bandwidth is related to $g_mF/C$ where $g_m$ is the transconductance of the cell, F is the feedback factor, and C is the value of the integrating capacitor, in this case C101. Since $g_m$ for each cell is proportional to the bias current, $I_{TLO}$ and $I_{THI}$ can be selected so that $g_mF/C$ is the same in both high and low gain modes.

Figure 13:
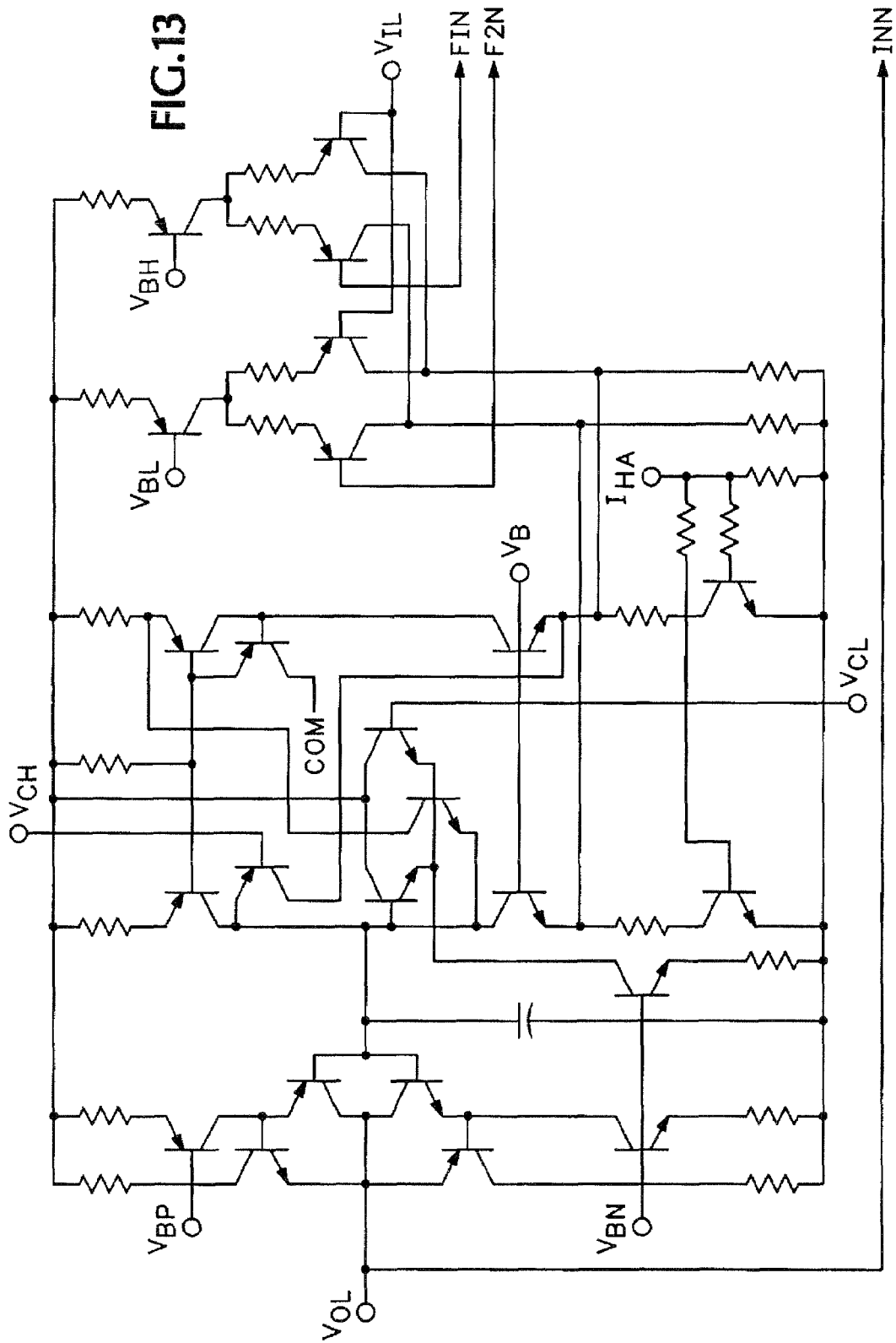
FIGS. 13 and 14 illustrate some embodiments of further refinements to a selectable gain amplifier according to the inventive principles of this patent.
Figure 14:
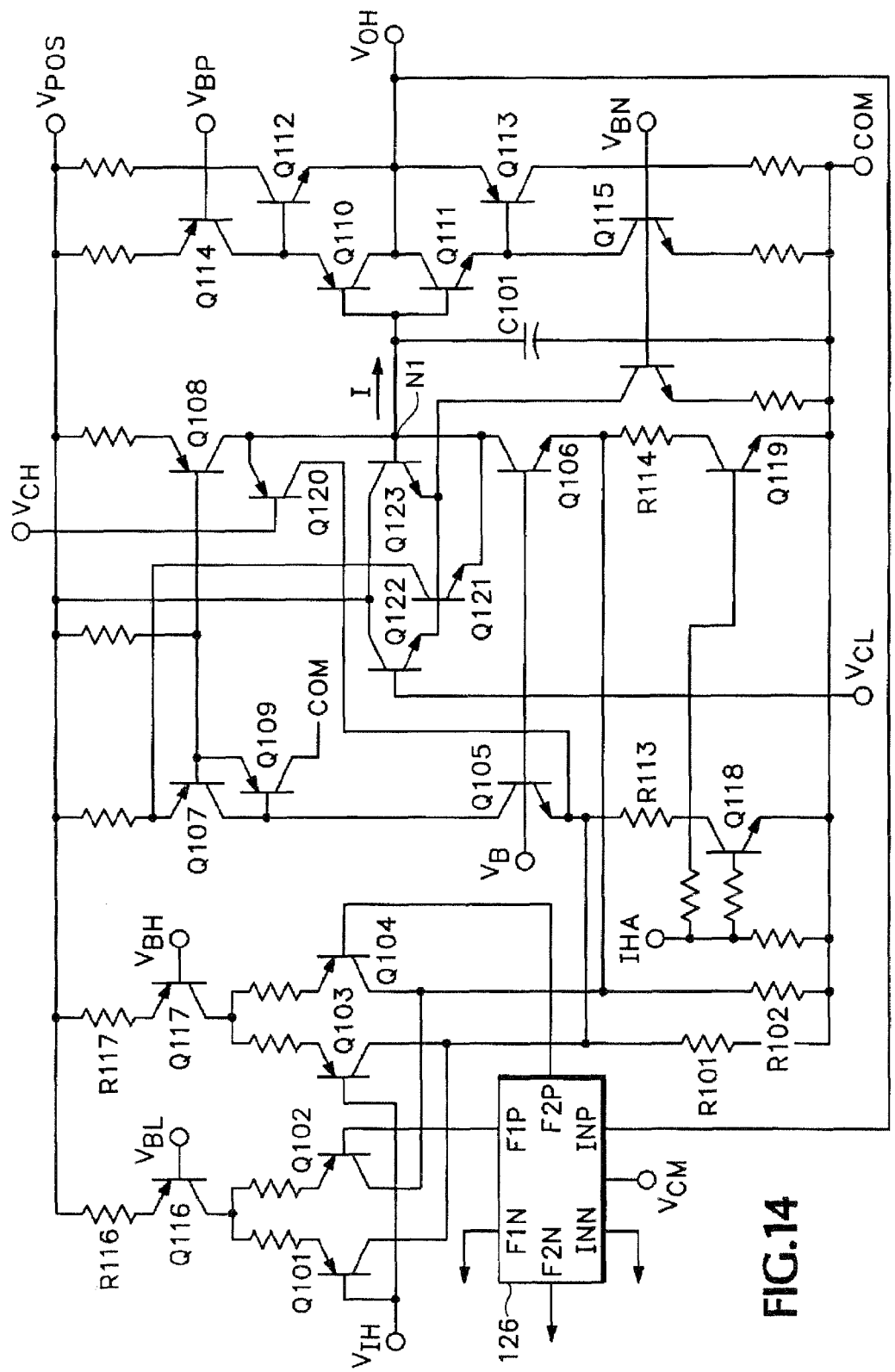

FIGS. 13 and 14 illustrate some further refinements according to the inventive principles of this patent, this time in the context of a fully differential embodiment of a selectable gain amplifier. The circuit is arranged roughly in left and right halves shown in FIGS. 13 and 14, respectively, these halves corresponding generally to the top and bottom halves, respectively, of the embodiment of FIG. 11. For purposes of illustration, a positive power supply and a power supply common connection are labeled $V_{POS}$ and COM, respectively.

The circuit of FIG. 14 includes two gm cells Q101,Q102 and Q103,Q104 having their outputs in parallel and driving load resistors R101 and R102 in much the same manner as the circuit of FIG. 12. Here, the gm cells are selectively enabled by applying a bias voltage $V_{BL}$ to transistor Q116, which supplies a bias current $I_{TLO}$ to the Q101,Q102 pair, in low-gain mode, and by applying a bias voltage $V_{BH}$ to transistor Q117, which supplies a bias current $I_{THI}$ to the Q103,Q104 pair, in high-gain mode. The relative values of resistors R116 and R117 may be adjusted to provide the different bias currents $I_{TLO}$ and $I_{THI}$.

The folded cascode transistors Q105,Q106 are arranged with their bases anchored to a bias voltage $V_B$. The current mirror in this example includes mirror transistors Q107 and Q108 arranged with emitter degeneration resistors and a beta helper transistor Q109. The output current $I_1$ from the folded cascode is generated at node N1 and applied to capacitor C101.

An additional pair of load resistors R113 and R114 pulls additional current through the folded cascode transistors Q105,Q106 in high gain mode. Resistors R113 and R114 are controlled by a pair of switches that are preferably implemented here as saturating bipolar junction transistors (BJTs) Q118,Q119 and controlled by the signal $I_{HA}$ which is enabled in high-gain mode. By increasing the currents through the folded cascode transistors in high-gain mode, this stage is able to source the higher current $I_{THI}$ in the input differential pairs. The result of the scaled second stage current is better matching of the amplifier dynamics between low and high-gain modes for similar large-signal and small-signal behavior. The use of lower currents in low-gain mode improves power consumption for that setting.

The push-pull output stage includes high-current output transistors Q112 and Q113 arranged in a totem-pole configuration and controlled by Q110 and Q111 which are biased by Q114 and Q115 in response to bias voltage signals $V_{BP}$ and $V_{BN}$, respectively.

Figure 15:
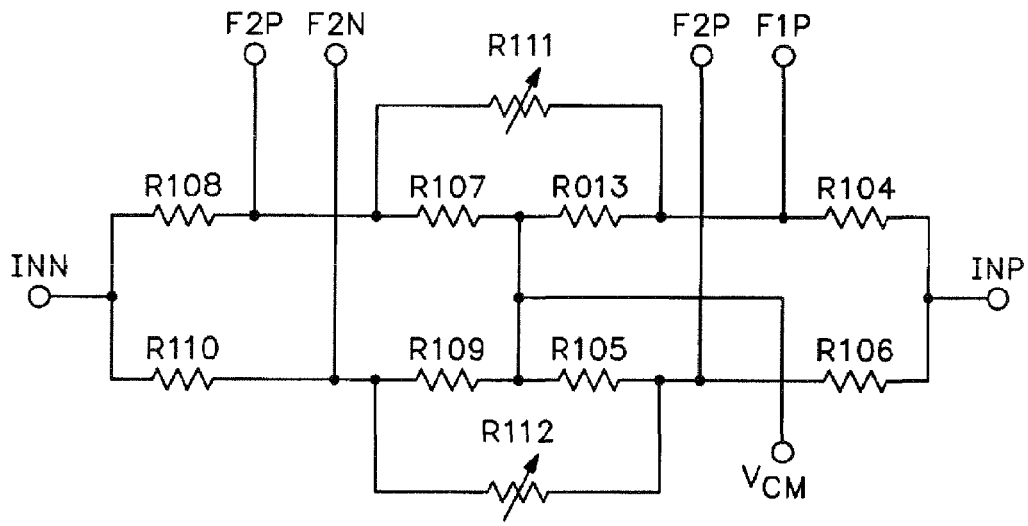
FIG. 15 illustrates an example embodiment of a feedback network for a selectable gain amplifier according to the inventive principles of this patent.

The feedback network 126 is now fully differential, having inputs for the output signals $V_{OH}$ and $V_{OL}$ from both circuit halves, and feedback outputs for both pairs of gm cells. It also has an input for a common mode reference signal $V_{CM}$. An example arrangement for the feedback network is shown in FIG. 15 where variable resistors R111 and R112 may be used to adjust the network.

The structure and operation of the left-half circuit shown in FIG. 13 is essentially the same as the right-half circuit discussed above, but with the polarity and/or logic level of certain signals reversed accordingly.

Some additional inventive principles of this patent relate to self-limiting the output of an amplifier. In many situations it is useful to provide an amplifier with a self-limiting output, for example, if it is used to drive an analog-to-digital converter that does not have input overload protection.

FIG. 14 also illustrates an embodiment of a self-limiting circuit for an amplifier in accordance with the inventive principles of this patent. A PNP transistor Q120 has its emitter connected to the output node N1 of the folded cascode arrangement, its base connected to a trigger (or "clamp") voltage reference $V_{CH}$, and its collector connected to the node between the load resistor R1 and the emitter of cascode transistor Q105. If the voltage of node N1 begins to rise a $V_{BE}$ above $V_{CH}$, the base-emitter junction of Q120 begins to conduct as a diode, and this has a gradual clamping effect on node N1. To make the clamping even sharper, however, current is diverted through the collector of Q147 to the load resistor R101. This results in a negative feedback effect that reduces the current that Q108 tries to drive into node N1.

Another transistor Q121 is arranged in a similar manner to prevent node N1 from being driven below a voltage that is determined by another clamp reference voltage $V_{CL}$. The arrangement of transistor Q121, however, is shown here with a further refinement to prevent reverse $V_{BE}$ breakdown which may be a problem if Q121 is fabricated using a process that cannot tolerate a large negative voltage across the base-emitter junction for extended periods of time. Thus, transistor Q121 is protected by a reverse $V_{BE}$ protector transistor Q123, and the arrangement of Q121 and Q122 performs essentially the same function as Q120, but in such a way that it clamps the output at two $V_{BE}$'s from $V_{CL}$ rather than one. In the case of Q121, negative feedback is realized by feeding the diverted current from node N1 to the emitter of mirror transistor Q107 rather than one of the load resistors.

Interpolated Amplifier with Distributed GM Cells

Some additional inventive principles of this patent relate to variable gain amplifiers (VGAs) having continuously interpolated attenuators. An example of one such VGA has already been shown in FIG. 8 and is described in more detail in U.S. Pat. No. 5,077,541 by one of the inventors of the present patent. Some commercial embodiments are sold under the trademark X-AMP®. Numerous variations of, and improvements to, this architecture have been patented by one of the inventors of the present patent. For example, U.S. Pat. No. 5,684,431 discloses an arrangement having a differential architecture, some commercial embodiments of which are sold under the trademark DSX-AMP™. U.S. Pat. No. 6,525,601 B2 discloses another arrangement having transconductance stages with feedforward paths diverted to AC ground.

In the differential structure mentioned above (U.S. Pat. No. 5,684,431), the input signal is applied to a differential attenuator. Pairs of outputs from the attenuator are applied to corresponding pairs of inputs of a series of gm cells which are selectively enabled by an interpolator. Feedback from the main amplifier is applied to a separate, independent gm stage so that both inputs of each of the other gm cells can be coupled to the differential attenuator, thereby preserving the fully differential input capability. The gm cells are preferably of the "multi-tanh" type, which have better inherent linearity.

Figure 16:
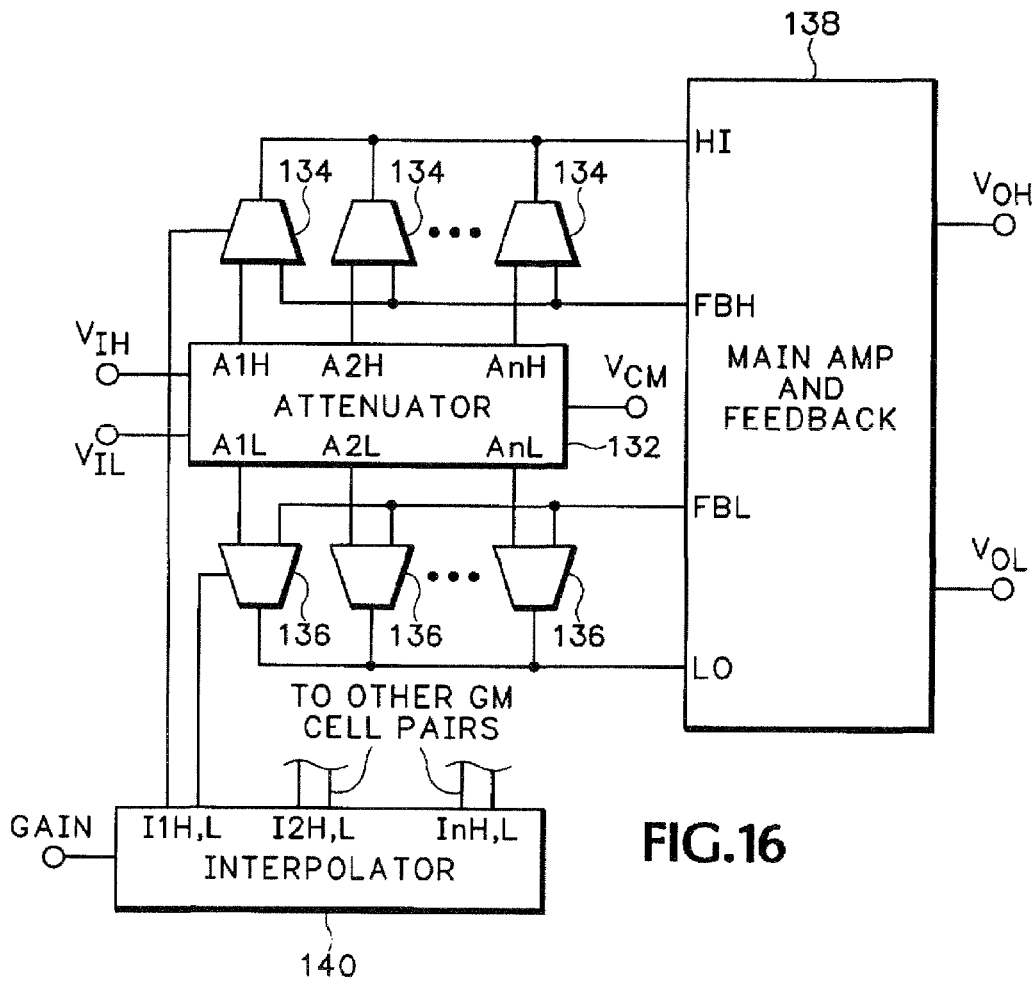
FIG. 16 illustrates an embodiment of a continuously interpolated VGA according to the inventive principles of this patent.

FIG. 16 illustrates an embodiment of a continuously interpolated VGA according to the inventive principles of this patent. The circuit of FIG. 16 utilizes an attenuator 132 having pairs of differential outputs A1H and A1L, A2H and A2L, etc. Rather than having a single series of gm cells, however, two series of interpolated gm cells are utilized. (For convenience, the circuit of FIG. 16 will be described as having "high" or "upper" and "low" or "lower" sides, but this is strictly an arbitrary naming convention.) One input of each of the first series of gm cells 134 is connected to a corresponding tap point A1H, A2H, etc., on the high side of the attenuator, while one input of each of the other series of gm cells 136 is connected to a corresponding tap point A1L, A2L, etc., on the low side of the attenuator. This leaves one input on each gm cell available to receive a feedback signal (FBH,FBL), while still preserving a fully differential input structure. The outputs HI,LO from the gm cells may be combined in any suitable manner in a main amplifier circuit 138. A single interpolator 140 may be used to control both series of gm cells with interpolator currents $I_{1H}/I_{1L}$, $I_{2H}/I_{2L}$, etc. If the Attenuator has a midpoint node, it may optionally be anchored to a common mode reference signal $V_{CM}$.

As a further refinement, opposing pairs of gm cells on the high and low sides may have opposite offsets built into their inputs, as for example, by utilizing ratioed emitter areas. This has the beneficial effect of causing the opposing pairs of gm cells to provide a multi-tanh response when their outputs are combined. In essence, they behave as distributed multi-tanh cells. The overall effect then, is an elegant and synergistic combination in which the improved linearity of multi-tanh gm cells is realized in an arrangement that preserves the fully differential input, while also allowing the use of feedback to the gm cells.

Figure 17:
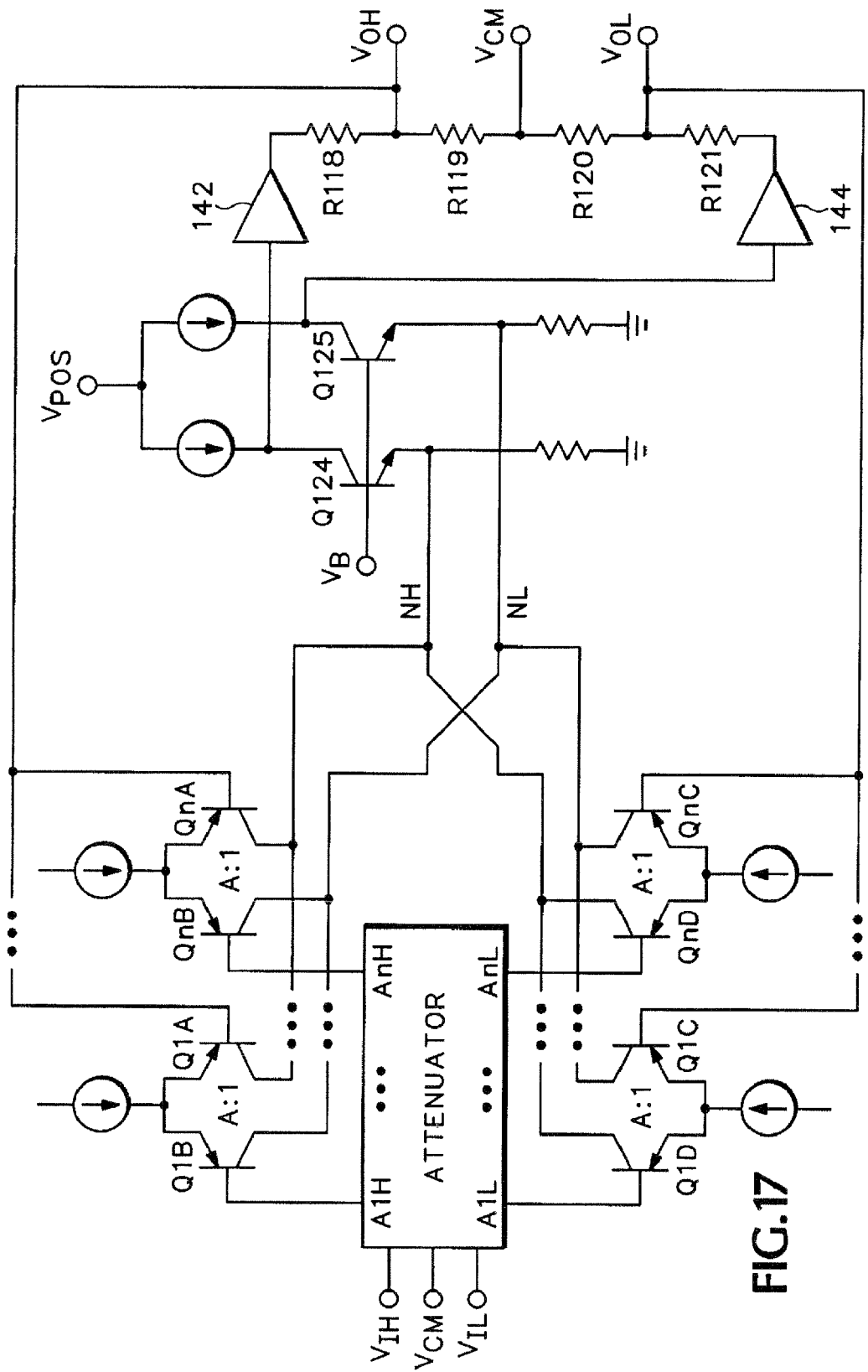
FIG. 17 illustrates another embodiment of a continuously interpolated VGA according to the inventive principles of this patent.

FIG. 17 illustrates another embodiment of a continuously interpolated VGA according to the inventive principles of this patent. In the embodiment of FIG. 17, the gm cells are implemented as differential pairs of BJT transistors having emitter area ratios of A:1 which means that, for example, Q1B has an emitter area that is "A" times as large as Q1A, and Q1D has an emitter area that is "A" times as large as Q1C. The pairs of gm cells are controlled by pairs of interpolator currents $I_{1H}$ and $I_{1L}$, $I_{2H}$ and $I_{2L}$, etc., from any suitable interpolator such as that disclosed in U.S. Pat. No. 6,489,849 which is also by one of the inventors of the present patent.

Both outputs from each of gm cells are combined at nodes NH and NL and then applied to a differential feedback network R118-R121 through cascode transistors Q124 and Q125 and buffers 142 and 144.

The feedback signal from the upper half of the feedback network is applied to the base of the "1" side transistor in each of the upper gm cells, while the base of the "A" side transistor is connected to the corresponding tap point on the high side of the attenuator. Likewise, the feedback signal from the lower half of the feedback network is applied to the base of the "1" side transistor in each of the lower gm cells, while the base of the "A" side transistor is connected to the corresponding tap point on the low side of the attenuator.

It can be shown that the effective transconductance for each pair of gm cells in FIG. 17 is given by:

$$g_m = g_{m0} \frac{4A}{(1+A)^2} \quad \text{(Eq. 1)}$$

where $g_{m0}$ is the $g_m$ that would result with A=1, that is, using the total bias current in a single differential pair. Alternatively, one of the outputs from each of the gm cells may be diverted to an AC ground, in this case, the output from the "A" side transistor, to prevent high-frequency feedthrough. The effective transconductance for each pair of gm cells would then be given by:

$$g_m = g_{m0} \frac{2}{(1+A)^2} \quad \text{(Eq. 2)}$$

Thus, when both outputs from each gm cell are used, a high transconductance and better noise performance is possible, but at the risk of high-frequency feedthrough, whereas diverting one output from each gm cell to AC ground reduces the risk of feedthrough but results in lower transconductance.

The midpoint of the feedback network R118-R121 is preferably anchored to the same common mode voltage reference $V_{CM}$ as the midpoint terminal of the attenuator if one exists. Other arrangements are possible. For example, the midpoint of the feedback network may tied to some other reference, it may be left floating, or it may be connected to an AC ground through a bypass capacitor which helps in high frequency applications. The VCM connection to the input attenuator may be used as a good way to set the input common mode voltage through the attenuation resistors, but is not strictly required. The input common mode voltage could be set up by other means, or this connection could be left floating, or tied to an AC ground through a bypass capacitor, and other arrangements are possible.

Although the output feedback divider is shown tapped to $V_{CM}$ in FIG. 17, the common mode control is still through node $V_B$ as shown in this embodiment since there are current sources at the collectors of Q124,Q125. The common mode control biasing for the folded cascode arrangement may be done as shown in FIGS. 18 and 19, or in other ways, for example, by fixing $V_B$ and servoing the current sources above Q124, Q125, etc.

Figure 18:
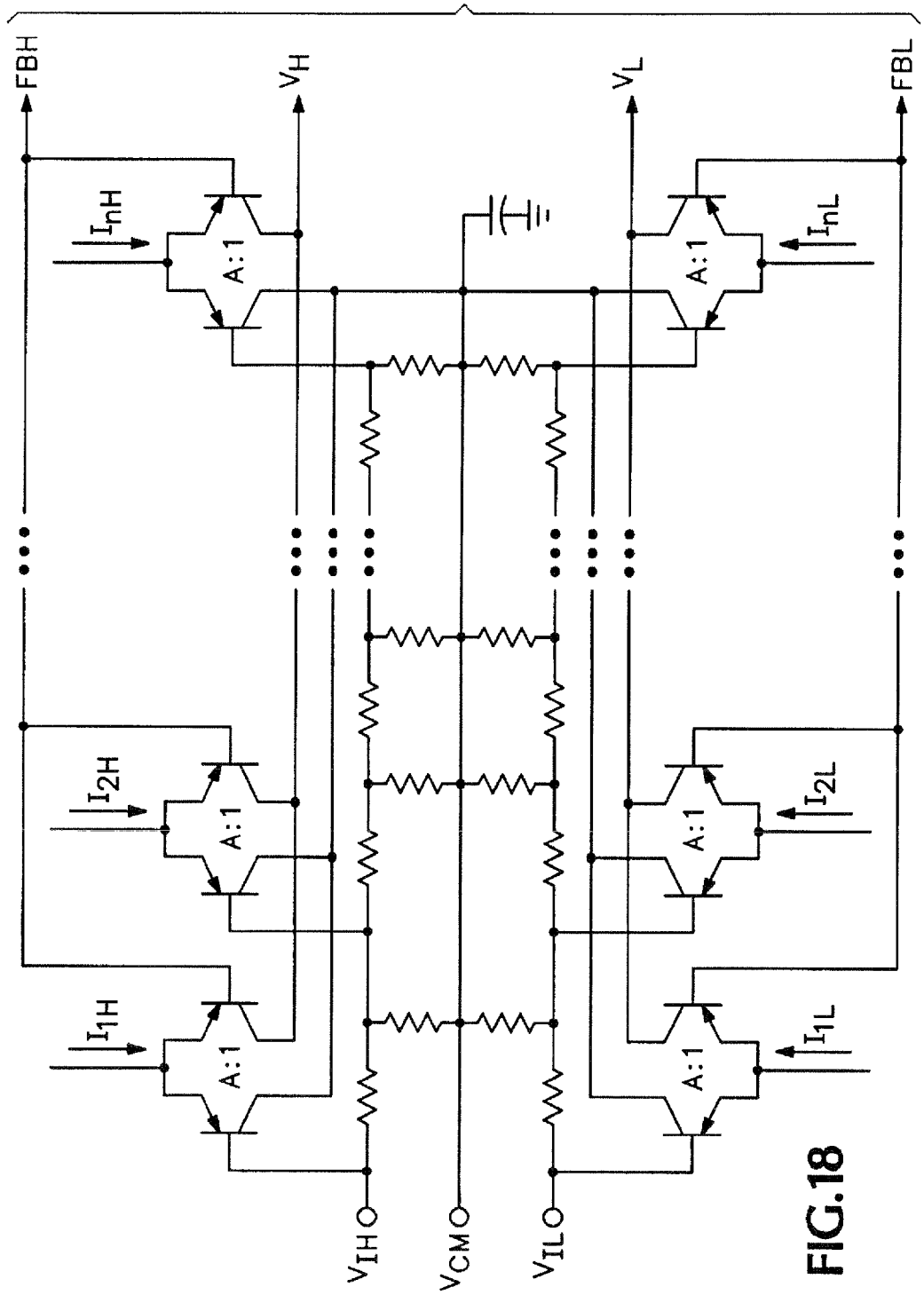
FIGS. 18 and 19 illustrate some preferred implementation details of an embodiment of a continuously interpolated VGA according to the inventive principles of this patent.
Figure 19:
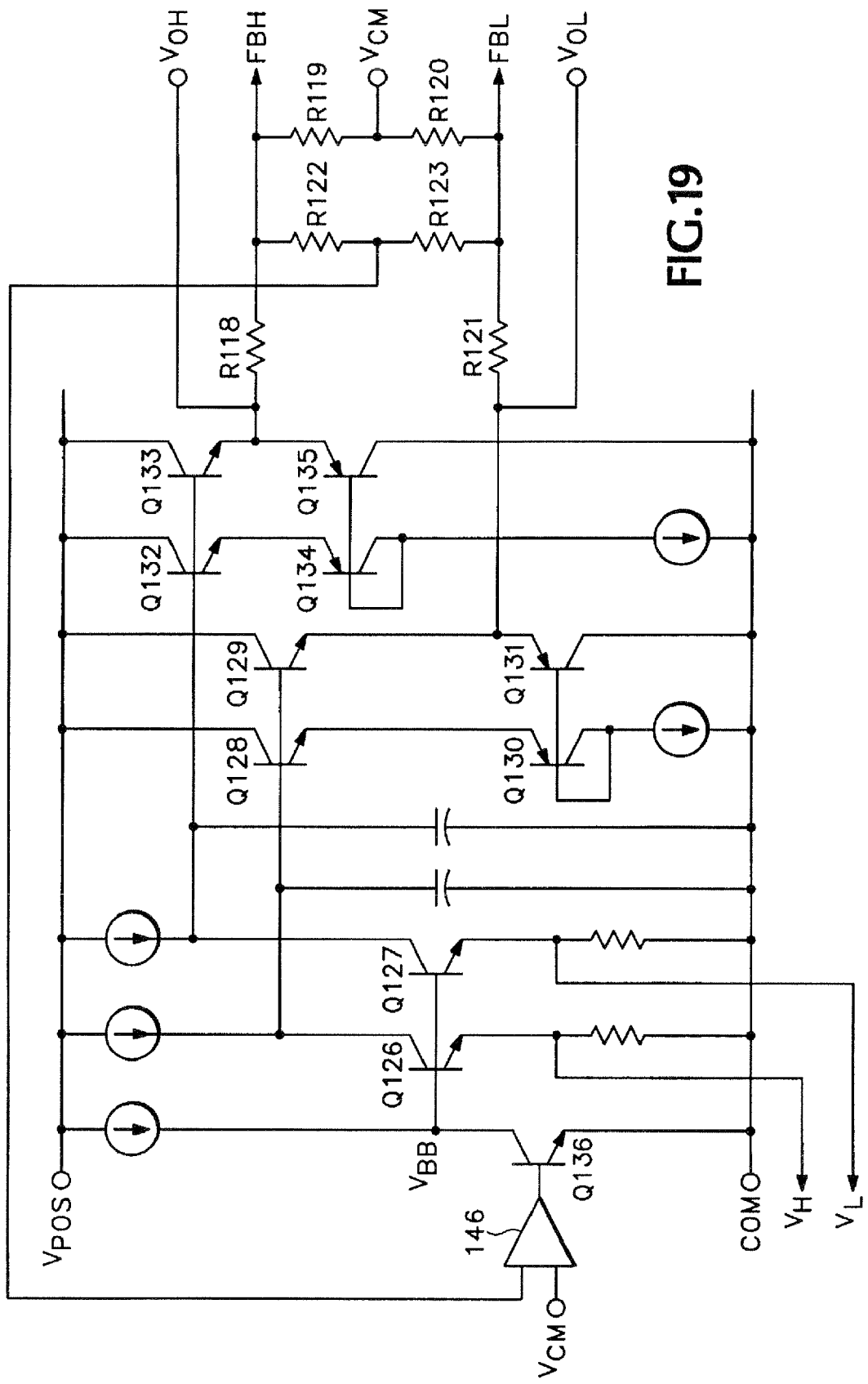

FIGS. 18 and 19 illustrate some preferred implementation details of an embodiment of a continuously interpolated VGA according to the inventive principles of this patent. The attenuator in FIG. 18 may be described as a "center tapped" attenuator having a mid-point conductor along its entire length which is anchored to a common mode voltage reference $V_{CM}$. As with the embodiment of FIG. 17, the circuit in FIG. 18 has opposing pairs of "A:1" gm cells controlled by pairs of interpolator currents $I_{1H}$ and $I_{1L}$, $I_{2H}$ and $I_{2L}$, etc. The "A" side input of each gm cell is connected to a corresponding tap point on the attenuator. The "1" side input of the high side gm cells are commonly connected to receive the feedback signal $V_{FBH}$, and the "1" side input of the low side gm cells are commonly connected to receive the feedback signal $V_{FBL}$. The outputs from the "A" side transistors are all diverted to AC ground. The outputs from the "1" side transistors on the high side are connected together at node NH, while the "1" side transistors on the low side are connected together at node NL.

Referring to FIG. 19, the two output signals $V_H$ and $V_L$ at nodes NH and NL are applied to the emitters of cascode transistors Q126 and Q127, respectively. The outputs from the cascode transistors drive push-pull output stages Q128-Q131 and Q132-Q135 which are set up as translinear loops to define their output currents. The feedback network is arranged as in FIG. 17 with a midpoint anchored to the common mode voltage reference $V_{CM}$.

The common mode voltage at the feedback network is forced to $V_{CM}$ by an operational amplifier (op amp) 146 that controls the anchor voltage $V_{BB}$ at the bases of the cascode transistors Q126 and Q127. The voltage at the midpoint of the feedback network is sampled through resistors R122 and R123 and applied to one input of the op amp. The other input of the op amp is referenced to $V_{CM}$. The output of the op amp drives a transistor Q136, which is biased by current source 148. The op amp servos the loop by generating whatever anchor voltage $V_{BB}$ is needed at the bases of the cascode transistors to force the midpoint of the feedback network to $V_{CM}$.

Referring again to FIG. 14, some switches are preferably implemented as saturating BJT transistors such as Q118 or Q119 since the $V_{CE}$ of such a transistor may be as low as a few hundred millivolts or even lower if the switch is made large enough. Operating a transistor in saturation, however, can cause problems such as unwanted current flow in the substrate of an integrated circuit. Unwanted current flow in the substrate can cause numerous problems such as cross-talk, latch-up, etc. If, however, an embodiment of the present invention is implemented on an integrated circuit that is fabricated with a dielectric isolation process such as silicon-on-insulator (SOI), a saturating BJT switch may be fabricated in a dielectrically isolated well.

Numerous inventive principles have been described above, and each has independent utility. In some cases, additional benefits and advantages are realized when the principles are utilized in various combinations with one another. For example, preferred embodiments of individual LNAs, VGAs, and selectable gain amplifiers have been described above. Embodiments of these individual inventions, however, may be combined to form a complete amplifier system as shown in FIG. 4. Such a system may be implemented according to the inventive principles of this patent to provide ultrasound and sonar time-gain control, high performance automatic gain control (AGC), I/Q signal processing, or high speed drive for an ADC.

Some of the embodiments disclosed in this patent application have been described with specific signals implemented as current-mode or voltage mode signals, but the inventive principles also contemplate other types of signals, whether characterized as voltages or currents. Likewise, some semiconductor devices are described as being specifically NPN or PNP BJTs, but in many cases different polarities or different device types such as J-FETs or CMOS transistors can also be utilized.

Thus, the embodiments described herein can be modified in arrangement and detail without departing from the inventive concepts. For example, an embodiment of a selectable gain amplifier has been described above with two gain ranges, but it will be apparent that the inventive principles may be applied to make an amplifier with more than two gain ranges. Likewise, an interpolated amplifier has been described as having interpolated gm cells for controlling the gain, but it will be apparent that these need not strictly be transconductance cells. Thus the term gm cell as used herein is understood to also refer to other apparatus that can interpolate between attenuator tap points under control of an interpolator.

Accordingly, such changes and modifications are considered to fall within the scope of the following claims.

The invention claimed is:

1. A continuously interpolated variable gain amplifier comprising:
    an attenuator having a first series of tap points and a second series of tap points to generate a series of differential outputs at corresponding pairs of the first and second series of tap points in response to an input signal;
    a first series of interpolated gm cells having outputs combined to generate a first output signal, each of the first gm cells having a first input coupled to one of the first series of tap points, and a second input coupled to receive a first feedback signal; and
    a second series of interpolated gm cells having outputs combined to generate a second output signal, each of the second gm cells having a first input coupled to one of the second series of tap points, and a second input coupled to receive a second feedback signal;
    where the first and second output signals are differential signals, and one side of each output signal is diverted to an AC ground.

2. The amplifier of claim 1 further comprising:
    a main amplifier circuit coupled to the first and second series of gm cells to generate a final output signal and the first and second feedback signals in response to the first and second output signals.

3. The amplifier of claim 1 where corresponding pairs of the first and second series of gm cells have opposing input offsets.

4. The amplifier of claim 1 where:
    each gm cell in the first series has a first output coupled to the first outputs of the other gm cells in the first series and a second output coupled to the second output of the other gm cells in the first series; and
    each gm cell in the second series has a first output coupled to the first outputs of the other gm cells in the second series and a second output coupled to the second output of the other gm cells in the second series.

5. The amplifier of claim 1 where the first and second output signals are differential signals that are cross-coupled.

6. The amplifier of claim 1 where each gm cell comprises a differential pair of transistors arranged to be controlled by an interpolator current.

7. The amplifier of claim 6 where each differential pair of transistors has an area ratio arranged so that corresponding pairs of the first and second series of gm cells have opposite input offsets.

8. The amplifier of claim 2 where the main amplifier circuit includes a feedback network to generate the first and second feedback signals in response to the first and second output signals.

9. The amplifier of claim 8 where the feedback network includes a common mode reference terminal.

10. The amplifier of claim 9 where the common mode reference terminal is coupled to an AC ground.

11. The amplifier of claim 8 further comprising a servo loop to set the common mode of the final output signal.

12. The amplifier of claim 11 where:
    the main amplifier circuit includes a cascode arrangement and an output stage to drive the feedback network; and
    the servo loop comprises a circuit to drive the bias terminal of the cascode arrangement.

13. The amplifier of claim 11 where:
    the main amplifier circuit includes a cascode arrangement and an output stage to drive the feedback network; and
    the servo loop comprises a circuit to servo current sources for the cascode arrangement.

14. The amplifier of claim 8 where:
    the main amplifier circuit includes first and second final output terminals to provide the final output signal as a differential signal, and first and second feedback terminals to provide the first and second feedback signals; and the feedback network comprises a divider network coupled to the first and second final output terminals and the first and second feedback terminals.

15. The amplifier of claim 14 further comprising a sample network coupled to the feedback network.

16. The amplifier of claim 15 where the divider network comprises:
- a first resistor coupled between the first final output terminal and the first feedback terminal;
- a second resistor coupled between the first feedback terminal and a common mode terminal;
- a third resistor coupled between the common mode terminal and the second feedback terminal; and
- a fourth resistor coupled between the second feedback terminal and the second final output terminal.

17. The amplifier of claim 16 where the sample network comprises:
- a fifth resistor coupled between the first feedback terminal and a sample node; and
- a sixth resistor coupled between the sample node and the second feedback terminal.

18. The amplifier of claim 17 where the common mode terminal is coupled to an AC ground, and the amplifier further comprises a servo loop to set the common mode of the final output signal in response to the signal at the sample node.

* * * * *